(12) United States Patent
Tan et al.

(10) Patent No.: US 11,742,389 B2
(45) Date of Patent: Aug. 29, 2023

(54) SEMICONDUCTOR STRUCTURE AND METHOD FOR FORMING THE SAME

(71) Applicant: Vanguard International Semiconductor Corporation, Hsinchu (TW)

(72) Inventors: Hung-Chih Tan, Kaohsiung (TW); Hsing-Chao Liu, Jhudong Township, Hsinchu County (TW); Chih-Cherng Liao, Jhudong Township (TW); Hsiao-Ying Yang, Hsinchu (TW); Kai-Chuan Kan, Hsinchu (TW); Jing-Da Li, Kaohsiung (TW)

(73) Assignee: VANGUARD INTERNATIONAL SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 17/323,418

(22) Filed: May 18, 2021

(65) Prior Publication Data
US 2022/0376052 A1 Nov. 24, 2022

(51) Int. Cl.
*H01L 29/76* (2006.01)
*H01L 29/94* (2006.01)
*H01L 31/062* (2012.01)
*H01L 29/10* (2006.01)
*H01L 29/66* (2006.01)

(52) U.S. Cl.
CPC ...... *H01L 29/1095* (2013.01); *H01L 29/6656* (2013.01); *H01L 29/66636* (2013.01)

(58) Field of Classification Search
CPC ............. H01L 29/1095; H01L 29/6656; H01L 29/66636

USPC ........................................................ 257/330
See application file for complete search history.

(56) References Cited

U.S. PATENT DOCUMENTS

| 7,952,142 | B2 * | 5/2011 | Wu ................ H01L 21/823468 |
| | | | 257/E27.088 |
| 9,716,171 | B2 | 7/2017 | Kim et al. |
| 2002/0055220 | A1 | 5/2002 | Soderbarg et al. |
| 2012/0025323 | A1 * | 2/2012 | Teo ........................ H01L 29/401 |
| | | | 257/E27.06 |
| 2015/0228742 | A1 | 8/2015 | Kim et al. |
| 2017/0352731 | A1 | 12/2017 | Kuo et al. |

OTHER PUBLICATIONS

Taiwanese Office Action and Search Report for Taiwanese Application No. 110101360, dated Jul. 19, 2021.

* cited by examiner

*Primary Examiner* — Theresa T Doan
(74) *Attorney, Agent, or Firm* — Birch, Stewart, Kolasch & Birch, LLP

(57) ABSTRACT

A method for forming a semiconductor structure includes providing a substrate including a first region with a first gate structure and a second region with a second gate structure. First to third dielectric layers are formed on the substrate. The third dielectric layer is patterned to form a first portion in the first region and a second portion in the second region. The second region is covered and at least a portion of the first portion is removed to form a first mask. The second dielectric layer is pattern by using the first mask and the second portion as the second mask to expose a portion of the first dielectric layer. The portion of the first dielectric layer is removed to form a first stacked spacer on the first gate structure and a second stacked spacer on the second gate structure.

15 Claims, 9 Drawing Sheets

SEMICONDUCTOR STRUCTURE AND METHOD FOR FORMING THE SAME

TECHNICAL FIELD

Some embodiments of the present disclosure relate to a semiconductor structure and method for forming the same, and in particular to a semiconductor structure including stacked spacers with different widths and method for forming the same.

BACKGROUND

Due to rapid developments in the semiconductor industry, in order to obtain higher efficiency and smaller sizes at a lower cost, a process for the miniaturization of semiconductor devices has been developed. However, when designing of electronic products, problems arise from the miniaturizing semiconductor structures.

In high-voltage devices (HV devices), gate spacers with sufficient width are generally required to reduce a field effect between the gate electrode and the source/drain region in the high-voltage devices. However, in low-voltage devices (LV devices), only gate spacer with a shorter width is required to maintain the normal operation of the low-voltage devices. As a result, when the high-voltage devices and the low-voltage devices have different requirements for the width of the gate spacer, various manufacturing challenges will arise when manufacturing an integrated structure, such as system on chip (SOC), which integrates high-voltage devices and low-voltage devices on the same chip.

Therefore, although ordinary semiconductor structures have generally met the requirements for their intended uses, these ordinary semiconductor structures have not been fully satisfactory in all respects. Thus, there are still some manufacture problems to be solved regarding semiconductor structures used as an integrated structure comprising the high-voltage devices and the low-voltage devices.

SUMMARY

According to some embodiments of the present disclosure, a method for forming a semiconductor structure is provided. The method for forming a semiconductor structure comprises: providing a substrate comprising a first region and a second region. A first gate structure is formed on the first region. A second gate structure is formed on the second region. A first dielectric layer, a second dielectric layer, and a third dielectric layer are sequentially formed on the substrate to cover the first gate structure and the second gate structure. The third dielectric layer is patterned to form a first portion of the third dielectric layer and a second portion of the third dielectric layer in the first region and the second region, respectively. The second portion is covered and the first portion of the third dielectric layer is partially removed to form a first etching mask. The second dielectric layer is patterned by using the first etching mask and the second portion of the third dielectric layer as a second etching mask, to expose a portion of the first dielectric layer. The portion of the first dielectric layer is removed to form a first stacked spacer and a second stacked spacer on the sidewalls of the first gate structure and the second gate structure, respectively. The width of the first stacked spacer is smaller than the width of the second stacked spacer.

According to some embodiments, a semiconductor structure is provided. The semiconductor structure comprises: a substrate, a first well region and a second well region, a body region, a first gate structure and a second gate structure, a first stacked spacer and a second stacked spacer, a first source/drain region and a second source/drain region, a first channel region and a second channel region. The substrate has a first doping type. The substrate comprises a low-voltage component region and a high-voltage component region. The first well region and the second well region have a second doping type that is the opposite of the first doping type. The first well region and the second well region are disposed in the low-voltage component region and the high-voltage component region, respectively. The body region has the first doping type. The body region is disposed in the second well region. The doping concentration of the body region is greater than the doping concentration of the second well region. The first gate structure and the second gate structure are disposed on the first well region and the second well region, respectively. The first stacked spacer and the second stacked spacer are disposed on sides of the first gate structure and the second gate structure, respectively. The width of the first stacked spacer is smaller than the width of the second stacked spacer. The first source/drain region and the second source/drain region are disposed on outer sides of the first stacked spacer and the second stacked spacer, respectively. The first channel region is located in the first well region and symmetrical to the first gate structure. The second channel region is located in the body region and asymmetrical to the second gate structure.

According to some embodiments of the present disclosure, the semiconductor structures may be applied in various types of semiconductor devices. In order to make the features and advantages of some embodiments of the present disclosure more understand, some embodiments of the present disclosure are listed below in conjunction with the accompanying drawings, and are described in detail as follows.

BRIEF DESCRIPTION OF THE DRAWINGS

Through the following detailed description and the accompanying drawings, a person of ordinary skill in the art will better understand the viewpoints of some embodiments of the present disclosure. It should be noted that, in accordance with standard practice in the industry, various features are not drawn to scale and are used for illustration purposes only. In fact, the dimensions of the various features may be arbitrarily increased or reduced for clarity of discussion.

DETAILED DESCRIPTION

Figure 1:
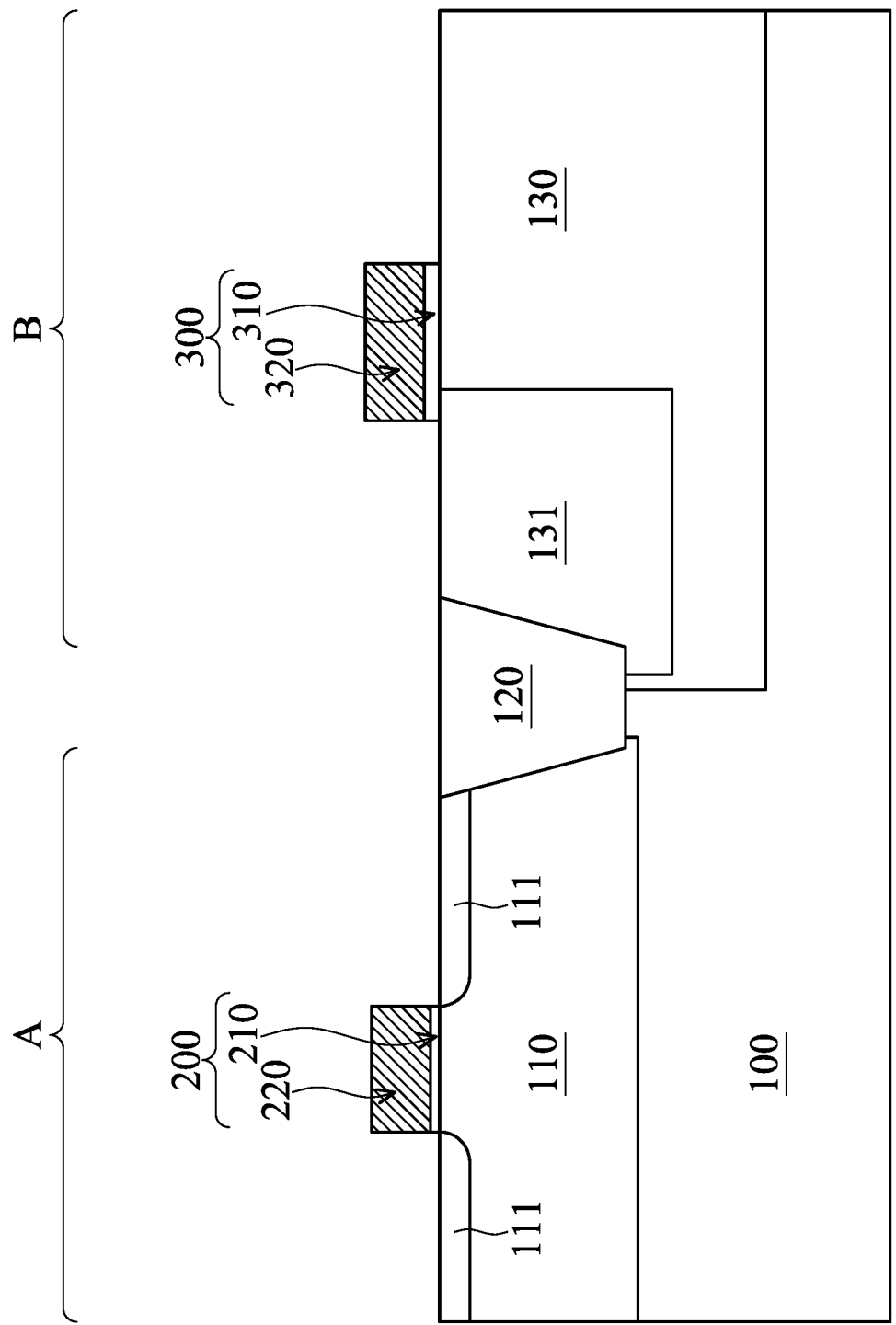
FIGS. 1-7 are schematic cross-sectional views of a semiconductor structure at different manufacturing processes, according to some embodiments of the present disclosure.

The following disclosure provides many different embodiments or examples for implementing different features of the semiconductor structure disclosed herein. Specific examples of each feature and its configuration are described below to simplify the embodiments of the present disclosure. Naturally, these are only examples and are not intended to limit the present disclosure. For example, if the description mentions that the first feature is formed on the second device, it may comprise an embodiment in which the first feature and second feature are in direct contact, or may comprise an embodiment in which additional feature is formed between the first feature and the second feature thereby the first feature and the second feature do not directly contact. In addition, some embodiments of the present disclosure may repeat reference numerals and/or letters in different examples. Such repetition is for conciseness and clarity, and is not used to indicate the relationship between the different embodiments and/or aspects discussed herein.

Some modifications of the embodiments are described below. In the different accompanying drawings and illustrated embodiments, reference numerals that are similar or the same are used to identify features that are similar or the same. It should be understood that additional operations and/or processes may be provided before, during, and after the method disclosed herein, and some of the described operations in some embodiments may be deleted or replaced with other embodiments of the method.

Furthermore, spatially relative terms, for example, "on", "over", "upper", "lower", "above", "below" or the like are used for ease of the present disclosure of one features relationship to another feature. The spatially relative terms are intended to encompass different orientations of the feature in use or operation, in addition to the orientation depicted in the accompany drawings. The features may be otherwise oriented (e.g., rotated 90 degrees or other orientations) and the spatially relative terms used herein should be interpreted accordingly.

Hereinafter, the terms "about", "approximately", and "substantially" usually mean within ±20% of a given value or a given range, for example, within ±10%, within 5%, within 3%, within 2%, within 1%, or within 0.5%. It should be noted that, the value provided in the specification is an approximate value, that is, without specific description of "about", "approximately", and "substantially", the meanings of the terms may still be implied.

FIGS. 1-7 are schematic cross-sectional views of a semiconductor structure at different manufacturing processes, according to some embodiments of the present disclosure.

Referring to FIG. 1, a substrate 100 comprising a first region A and a second region B, a first gate structure 200 formed on the substrate 100 and in the first region A, and a second gate structure 300 formed on the substrate 100 and in the second region B are provided. As shown in FIG. 1, the substrate 100 further comprises a first well region 110 located in the first region A, a second well region 130 located in the second region B, and an isolation structure 120 located between the first region A and the second region B. In some embodiments, the first region A is a low-voltage device region, and the second region B is a high-voltage device region.

In some embodiments, the substrate 100 may be or comprise a bulk semiconductor substrate, a semiconductor-on-insulator (SOI) substrate, or the like. The substrate 100 may be a doped (for example, using p-type or n-type dopants) or an undoped silicon substrate. In other embodiments, the substrate 100 may also be an epitaxial silicon substrate, a silicon germanium substrate, a silicon carbide substrate, a ceramic substrate, or the like, but it is not limited thereto.

In some embodiments, the conductivity types, such as n-type or p-type, of the substrate 100 and other components may be adjusted according to requirements. In the following, for example, the substrate 100 may be a first conductive type (or doping type), such as p-type, with dopants such as B, Al, Ga, In, $BF^{3+}$ ions, or a combination thereof, but it is not limited thereto. In some embodiments, the isolation structure 120 disposed in the substrate 100 and located between the first region A and the second region B may be used to define a chip region, and the isolation structure 120 is electrically isolated semiconductor devices located in the first region A and semiconductor devices located in the second region B. In some embodiments, the isolation structure 120 may comprise a shallow trench isolation (STI) structure, a local oxidation of silicon (LOCOS) structure, other suitable isolation features or a combination thereof. The material of the isolation structure 120 may comprise silicon dioxide, nitrogen-doped silicon oxide, silicon nitride, silicon oxynitride, the like or other suitable isolation materials.

Referring still to FIG. 1, in some embodiments, the first well region 110 in the first region A and/or the second well region 130 in the second region B is formed by ion implantation process and/or diffusion process. In some embodiments, the first well region 110 and the second well region 130 have a second conductive type that is the opposite of the first conductive type, such as n-type, with dopants such as N, P, As, Sb ions, or a combination thereof. In some embodiments, the doping concentration of the first well region 110 is in a range between about 1E+10 atoms/cm$^3$ and about 1E+15 atoms/cm$^3$, and the doping concentration of the second well region 130 is in a range between about 1E+9 atoms/cm$^3$ and about 1E+14 atoms/cm$^3$.

Referring still to FIG. 1, the first gate structure 200 on the first well region 110 in the first region A comprises a first gate dielectric layer 210 and a first gate electrode 220 formed on the first gate dielectric layer 210. In some embodiments, the material of the first gate dielectric layer 210 may comprise silicon oxide, silicon nitride, silicon oxynitride, high dielectric constant (high-k) material, a combination thereof, or other suitable dielectric materials. In some embodiments, the first gate dielectric layer 210 may be formed by thermal oxidation, chemical vapor deposition (CVD), or atomic layer deposition (ALD). The material of the first gate electrode 220 may comprise a metal silicide, amorphous silicon, polysilicon, one or more metals, metal nitride, conductive metal oxide, a combination thereof or other suitable conductive materials. For example, the metal may be gold (Au), nickel (Ni), platinum (Pt), palladium (Pd), iridium (Ir), titanium (Ti), chromium (Cr), tungsten (W), aluminum (Al), copper (Cu), the like or a combination thereof, but it is not limited thereto. The first gate electrode 220 may be formed by chemical vapor deposition, sputtering, a resistive thermal evaporation process, an electron beam evaporation process, or other suitable deposition processes.

As shown in FIG. 1, the second gate structure 300 on the second well region 130 in the second region B comprises a second gate dielectric layer 310 and a second gate electrode 320 formed on the second gate dielectric layer 310. In some embodiments, the forming methods and materials of the second gate dielectric layer 310 and the second gate electrode 320 may be the same or different with the forming methods and materials of the first gate dielectric layer 210 and the first gate electrode 220. In addition, in order to achieve a higher breakdown voltage, the thickness of the second gate dielectric layer 310 formed in the second region B may be greater than the thickness of the first gate dielectric layer 210. Further, the thickness and width of the second gate electrode 320 may be greater than the thickness and width of the first gate electrode 220.

Referring still to FIG. 1, in some embodiments, a lightly doped region 111 is formed in the first region A by an ion implantation process. In some embodiments, the lightly doped region 111 may be located on opposite sides of the first gate structure 200 as a pair. In some embodiments, a body region 131 is formed in the second region B by an ion implantation process. In some embodiments, the body region 131 may subsequently be electrically connected to a body contact of the high-voltage device in the second region B. In some embodiments, after forming the first gate structure 200 and the second gate structure 300, the lightly doped region 111 and the body region 131 are formed, respectively. In some embodiments, the lightly doped region 111 and the body region 131 are formed in the same or different process. The lightly doped region 111 and the body region 131 may be formed before or after any suitable process. Alternatively, the lightly doped region 111 and the body region 131 may be omitted. In some embodiments, the lightly doped region 111 and the body region 131 may each have the second conductivity type, which is the opposite of the first conductivity type. For example, the second conductivity type may be n-type, with dopants such as N, P, As, Sb ions, or a combination thereof. The doping concentration of the lightly doped region 111 is in a range between about 1E+10 atoms/cm$^3$ and about 1E+15 atoms/cm$^3$. In some embodiments, the doping concentration of the body region 131 is in the range between about 1E+10 atoms/cm$^3$ to about 1E+15 atoms/cm$^3$. In some embodiments, the depth of the body region 131 is greater than the depth of the lightly doped region 111. In other embodiments, the lightly doped region 111 and the body region 131 may also have opposite conductivity types. For example, the lightly doped region 111 has the second conductivity type, and the body region 131 has the first conductivity type. It is noticed that the conductivity types of the above-mentioned components are only exemplary, which can be adjusted according to the product design, and it is not limited thereto.

Figure 7:
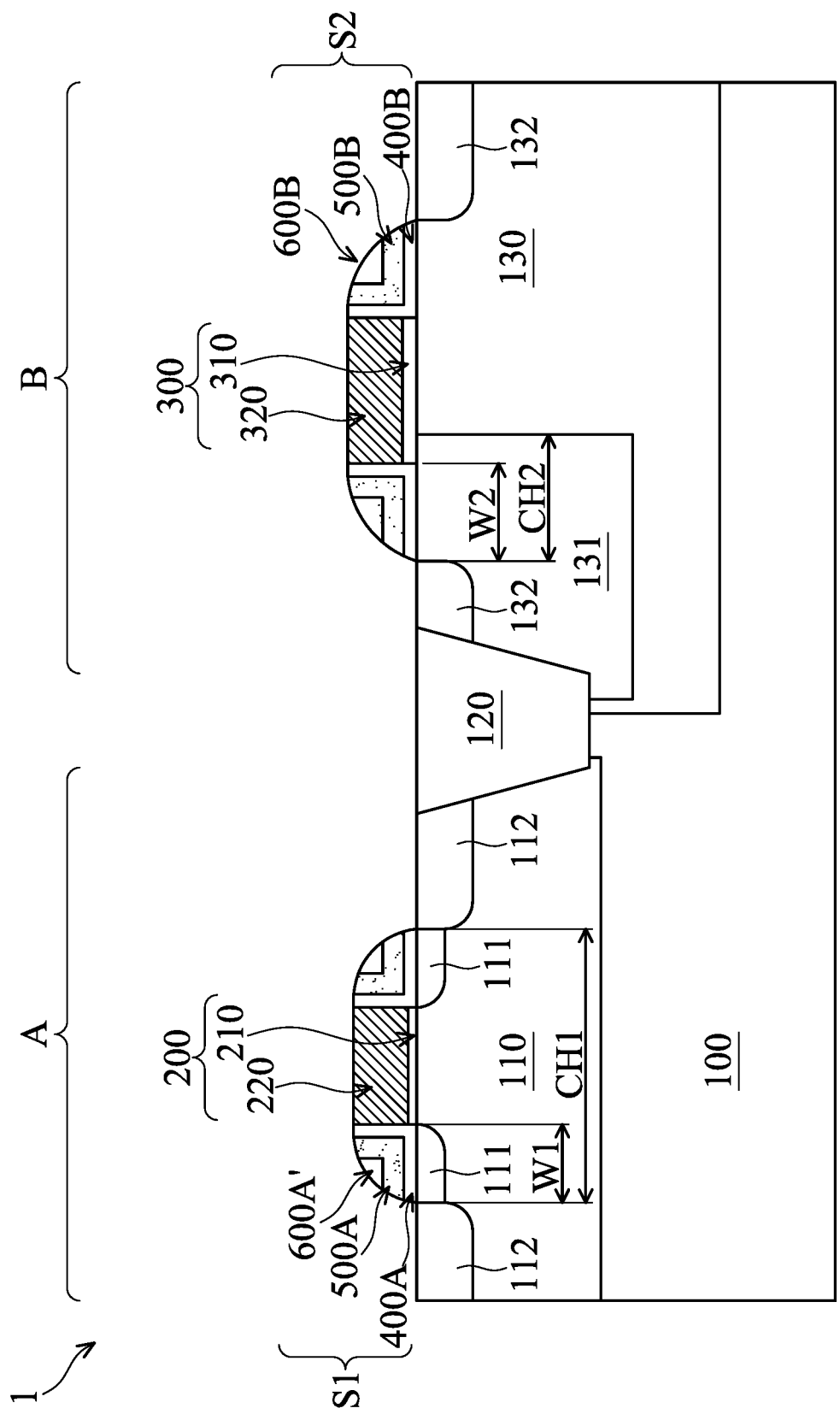

When the carriers between the gate structures (for example, the first gate structure 200 and the second gate structure 300) and the source/drain region (for example, the first source/drain region 112 and the second source/drain region 132, as shown in FIG. 7) subsequently formed on the opposite sides of the gate structures are accelerated by a high electric field, a hot-carrier effect (HCE) is induced. In some embodiments, the hot-carrier effect is reduced by forming the lightly doped region 111 in the first region A and the body region 131 in the second region B.

Figure 2:
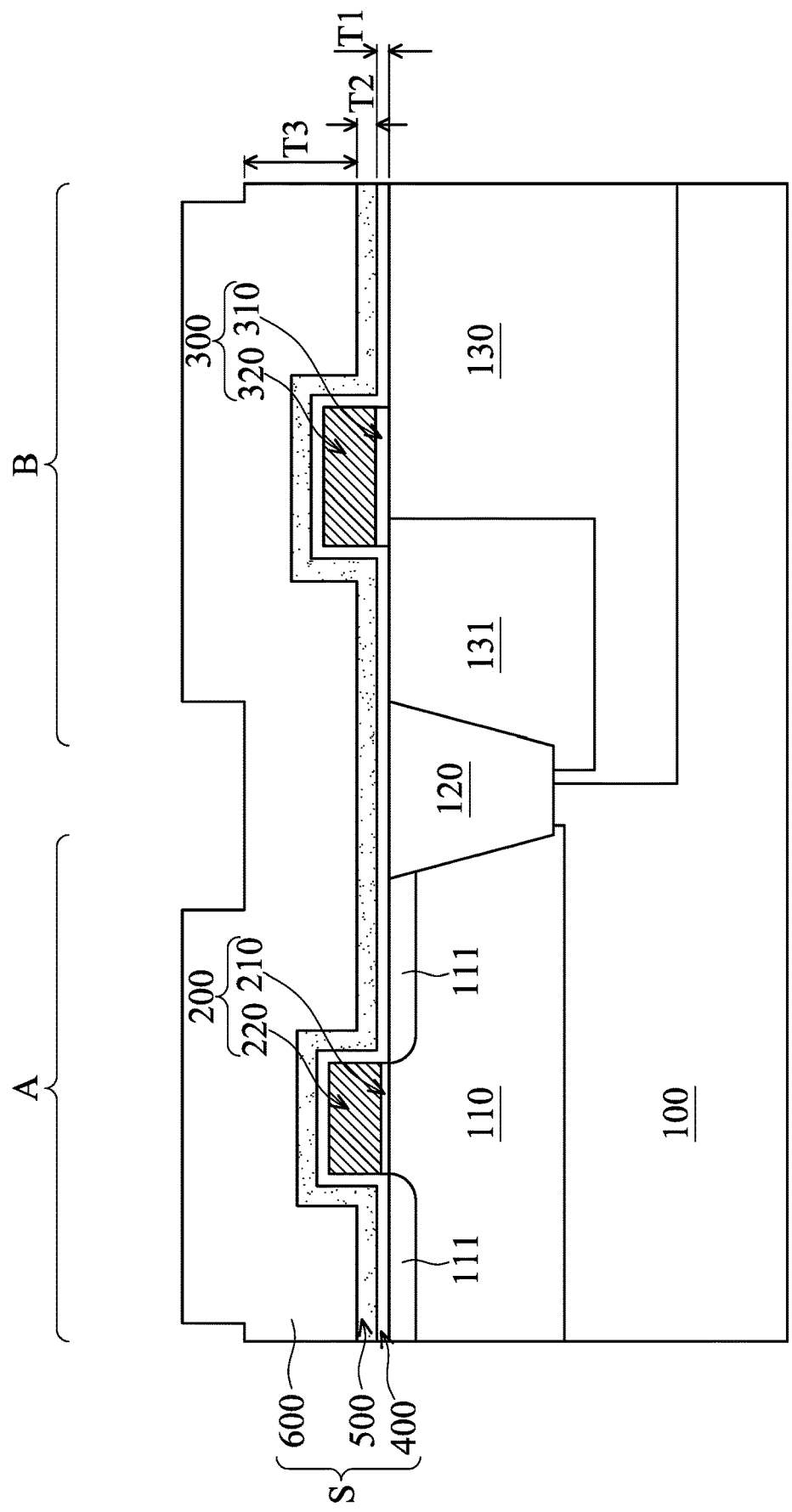

Referring to FIG. 2, a cross-sectional schematic view of forming a stack of dielectric layers S on the substrate 100 to cover the first gate structure 200 and the second gate structure 300 is illustrated. As shown in FIG. 2, the dielectric layer stack S comprises a first dielectric layer 400, a second dielectric layer 500 and a third dielectric layer 600 conformally formed on the substrate 100 and covering the first gate structure 200 and the second gate structure 300. In some embodiments, the first dielectric layer 400 is formed on the first gate structure 200 and the second gate structure 300. The second dielectric layer 500 is formed on the first dielectric layer 400. The third dielectric layer 600 is formed on the second dielectric layer 500. In some embodiments, the dielectric layer stack S is conformally formed by a deposition process. The deposition process for forming the dielectric layer stack S comprise a spin coating process, CVD, physical vapor deposition (PVD), ALD, a high density plasma chemical vapor deposition (HDPCVD), other suitable methods or a combination thereof, but it is not limited thereto.

In some embodiments, the dielectric layer stack S may comprise oxides such as silicon oxide, nitrides such as silicon nitride, silicon oxynitride, silicon oxide formed by tetraethoxysilane (TEOS), silicon oxide formed by silane (SiH$_4$), phosphosilicate glass (PSG), borophosphosilicate glass (BPSG), low dielectric constant (low-k) material and/or other suitable dielectric materials. The low-k dielectric material may comprise, but not limit to, fluorinated silicate glass (FSG), hydrogen silsesquioxane (HSQ), carbon-doped silicon oxide, amorphous fluorinated carbon, parylene, bis-benzocyclobutenes (BCB), polyimide, the like or a combination thereof.

In some embodiments, the dielectric layer stack S of the present disclosure comprises a plurality of dielectric layers with different etching selectivities. Thus, the width of the subsequently formed stacked spacer (for example, the first stacked spacer S1 and the second stacked spacer S2, as shown in FIG. 7) may be controlled by adjusting respective thickness and material of layer in the plurality of dielectric layers and adjusting the etching parameters correspondingly. In some embodiments, the first dielectric layer 400 and the second dielectric layer 500 have different etching selectivities, and the second dielectric layer 500 and the third dielectric layer 600 have different etching selectivities. In some embodiments, the first dielectric layer 400 and the second dielectric layer 500 are made of different materials and the second dielectric layer 500 and the third dielectric layer 600 are made of different materials. In some embodiments, the first dielectric layer 400 and the third dielectric layer 600 may each comprise an oxide, and the second dielectric layer 500 may comprise a nitride. In some embodiments, the first dielectric layer 400 and the third dielectric layer 600 may comprise the same or different oxides.

In some embodiments, the plurality of dielectric layers comprised in the dielectric layer stack S are formed with a specific thickness ratio, thereby forming a stacked spacer having a specific width. In some embodiments, the first dielectric layer 400 has a first thickness T1, the second dielectric layer 500 has a second thickness T2, and the third dielectric layer 600 has a third thickness T3. For example, the ratio of the first thickness T1, the second thickness T2, and the third thickness T3 may be about 1~3: 3~5: 10~30. In some embodiments, the first thickness T1 of the first dielectric layer 400 is in a range between about 100 Å and about 300 Å, for example, about 150 Å. The second thickness T2 of the second dielectric layer 500 is in a range between about 250 Å and about 500 Å. The third thickness T3 of the third dielectric layer 600 is in a range between about 800 Å to about 3000 Å. In some embodiments, when the third thickness T3 is greater, the adjustment range of partially removing a first portion of the third dielectric layer 600 to form an etching mask is greater. In some embodiments, as the third thickness T3 of the third dielectric layer 600 is greater, the second thickness T2 of the second dielectric layer 500 is correspondingly greater. As the second thickness T2 of the second dielectric layer 500 is greater, the first thickness T1 of the first dielectric layer 400 is correspondingly greater. The stacked spacer with a smaller width in the first region A and the stacked spacer with a greater width in the second region B are respectively formed by forming the dielectric layer stack S comprising dielectric layers with different etching selectivities and thicknesses and performing the subsequent anisotropic etching process. For example, the thicknesses of the second dielectric layer 500 and the third dielectric layer 600 that will be subsequently used as etching masks may be adjusted to form stacked spacers with required widths in the low-voltage devices in the first region A and in the high-voltage devices in the second region B, respectively.

Figure 3:
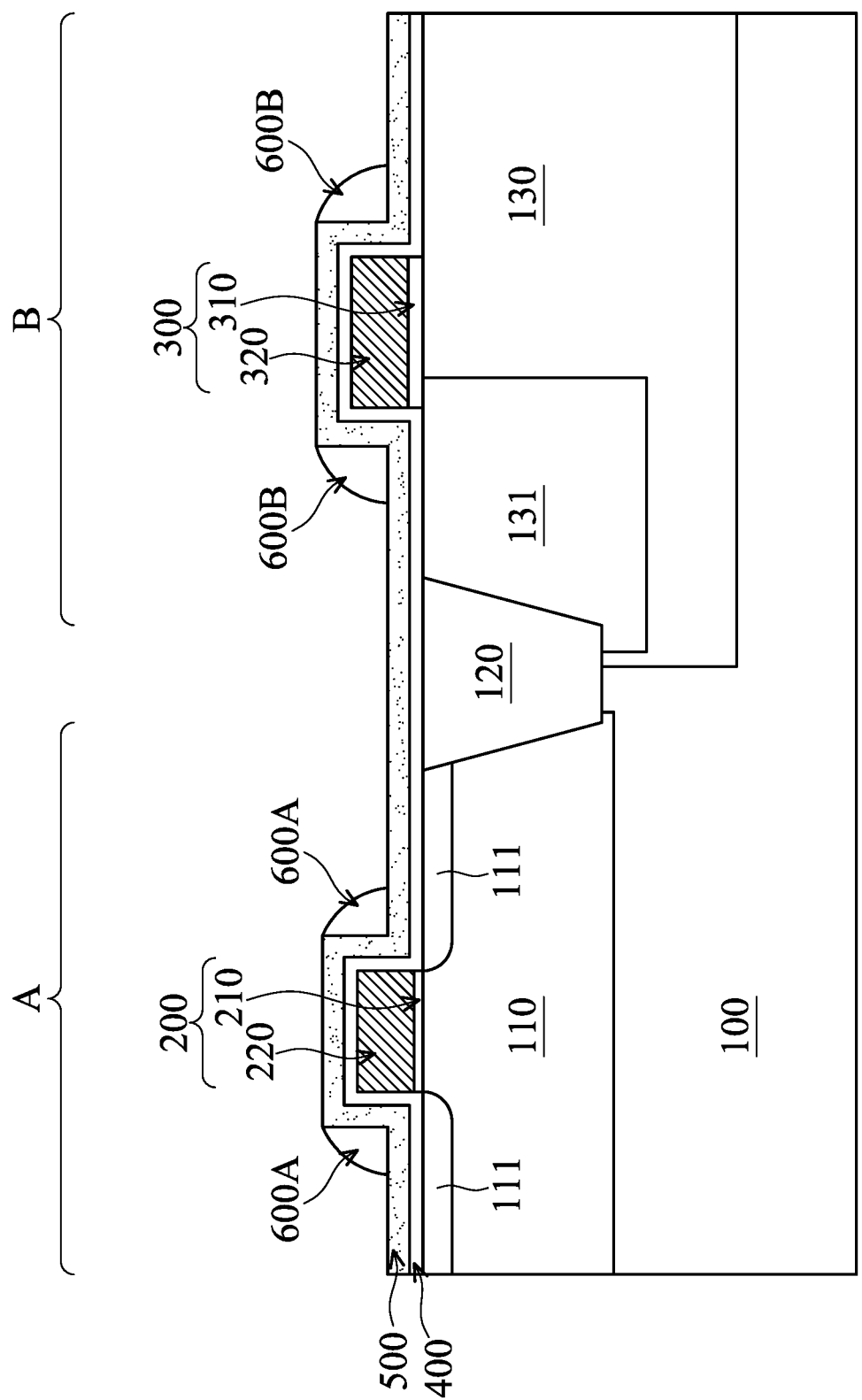

Referring to FIG. 3, the third dielectric layer 600 is etched to expose a top surface of the second dielectric layer 500 and form a first portion 600A of the third dielectric layer 600 in the first region A and a second portion 600B of the third dielectric layer 600 in the second region B. In some embodiments, the second dielectric layer 500 formed of a material different from the third dielectric layer 600 may be used as an etch stop layer. In some embodiments, the etching process for etching the third dielectric layer 600 may comprise dry etching and/or wet etching. In some embodiments, the aforementioned etching process is an anisotropic etching process. In some embodiments, the dry etching process may comprise reactive ion etching (RIE), neutral beam etching (NBE), inductively coupled plasma (ICP) etching, the like or a combination thereof. In some embodiments, an etching chemical used for the dry etching may comprise fluorocarbon-based chemicals (e.g. fluorinated hydrocarbon), such as tetrafluoromethane ($CF_4$), trifluoromethane ($CHF_3$) or the like. In some embodiments, an etching chemical used for the wet etching process may comprise a hydrofluoric acid (HF) diluted solution with, for example, ammonium fluoride ($NH_4F$), $HF/H_2O$, $H_3PO_4$, $H_2SO_4/H_2O$ or a combination thereof as a buffer agent. In some embodiments, since the etching of the third dielectric layer 600 is performed for the third dielectric layer 600, and the third dielectric layer 600 has a substantially uniform third thickness T3. It is possible to avoid damage to the second dielectric layer 500 used as the etch stop layer during performing etching of the third dielectric layer 600, thereby improving the reliability of the middle portion formed by subsequently etching the second dielectric layer 500.

In some embodiments, the first portion 600A of the third dielectric layer 600 is formed on the sidewall of the first gate structure 200. In particular, the first portion 600A is formed on the sidewall of the second dielectric layer 500 in the first region A. In some embodiments, the second portion 600B of the third dielectric layer 600 is formed on the sidewall of the second gate structure 300. In particular, the second portion 600B is formed on the sidewall of the second dielectric layer 500 in the second region B. In some embodiments, the first portion 600A and the second portion 600B of the third dielectric layer 600 have a shape similar to a spacer. In some embodiments, a top surface of the first portion 600A is substantially level with (or aligned with) a top surface of the second dielectric layer 500 on the first gate structure 200 in the first region A. In some embodiments, a top surface of the second portion 600B is substantially level with a top surface of the second dielectric layer 500 on the second gate structure 300 in the second region B.

Figure 4:
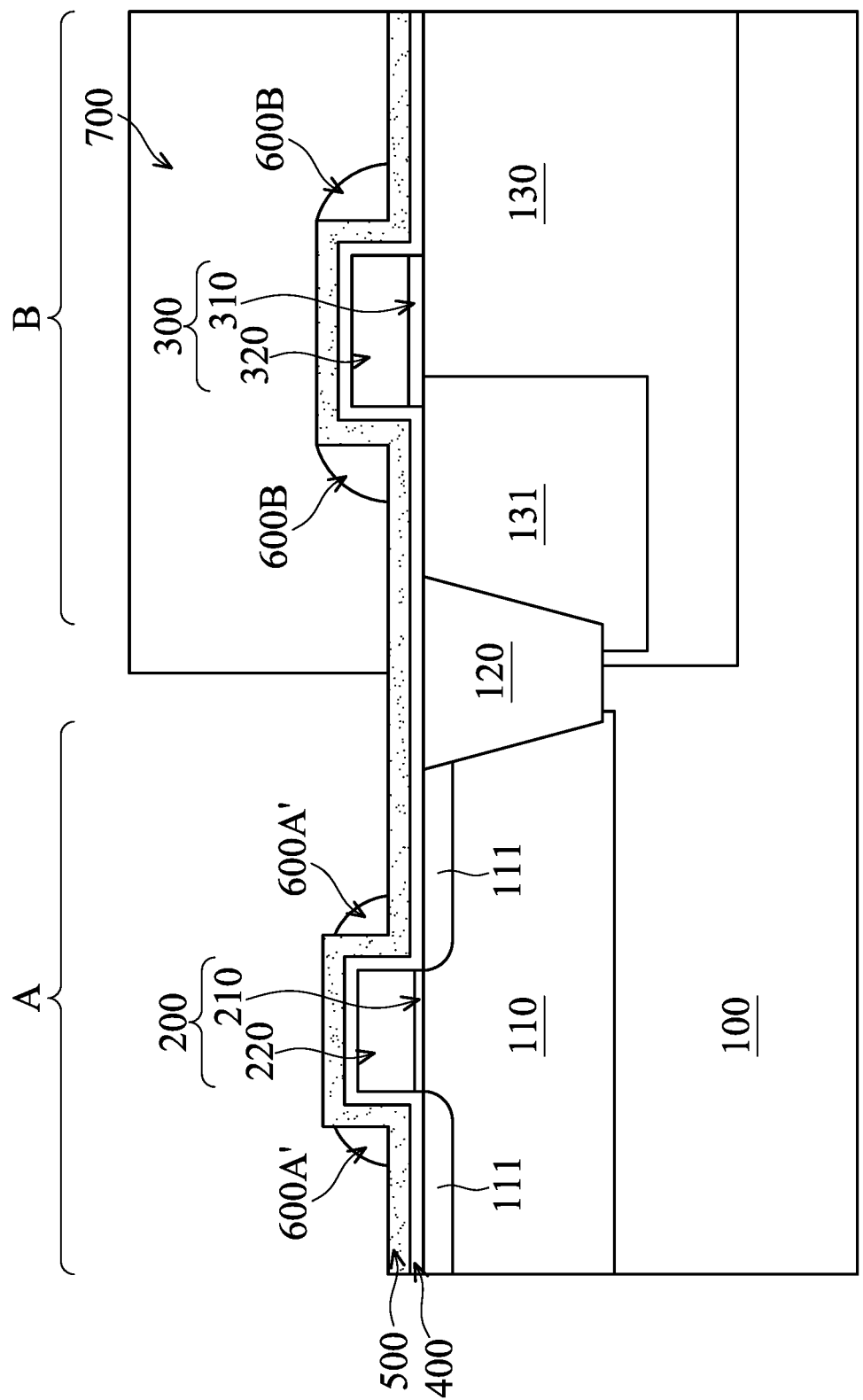

Referring to FIG. 4, a photoresist pattern 700 is formed in the second region B, and the photoresist pattern 700 covers the second region B and exposes the first portion 600A in the first region A. In some embodiments, the photoresist pattern 700 at least covers the second portion 600B in the second region B. In some embodiments, photoresist pattern 700 may be a patterned photoresist layer covering the second region B. Wherein, the patterned photoresist layer is formed by spin-coating photoresist agent to form a photoresist layer followed by exposing the photoresist layer using a suitable mask.

As shown in FIG. 4, after forming the photoresist pattern 700, the first portion 600A of the third dielectric layer 600 is etched by using the photoresist pattern 700 as an etching mask to reduce the size of the first portion 600A of the third dielectric layer 600 so as to form an etching mask 600A'. The width and/or height of the etching mask 600A' is smaller than the first portion 600A. Thus, when the second portion 600B is protected by the photoresist pattern 700 covering the second portion 600B, a portion of the first portion 600A is removed to form the etching mask 600A' with required width. In some embodiments, the etching mask 600A' is formed on the sidewalls of the second dielectric layer 500 and the first gate structure 200, and the second portion 600B is formed on the sidewalls of the second dielectric layer 500 and the second gate structure 300. In some embodiments, the etching process for reducing the size of the first portion 600A may be dry etching and/or wet etching. In some embodiments, the etching process and etchant used to reduce (or shrink) the first portion 600A may be the same as or different from the etching process and etchant used to etch the third dielectric layer 600.

In some embodiments, after reducing the first portion 600A, a top surface of the etching mask 600A' is lower than the top surface of the second dielectric layer 500 on the first gate structure 200 in the first region A. However, the top surface of the second portion 600B is still substantially level with the top surface of the second dielectric layer 500 on the second gate structure 300 in the second region B. In some embodiments, the width and/or height of the etching mask 600A' may be 10% to 90% of the first portion 600A, any combination of the foregoing ranges, or any desired range, but it is not limited thereto.

Figure 6:
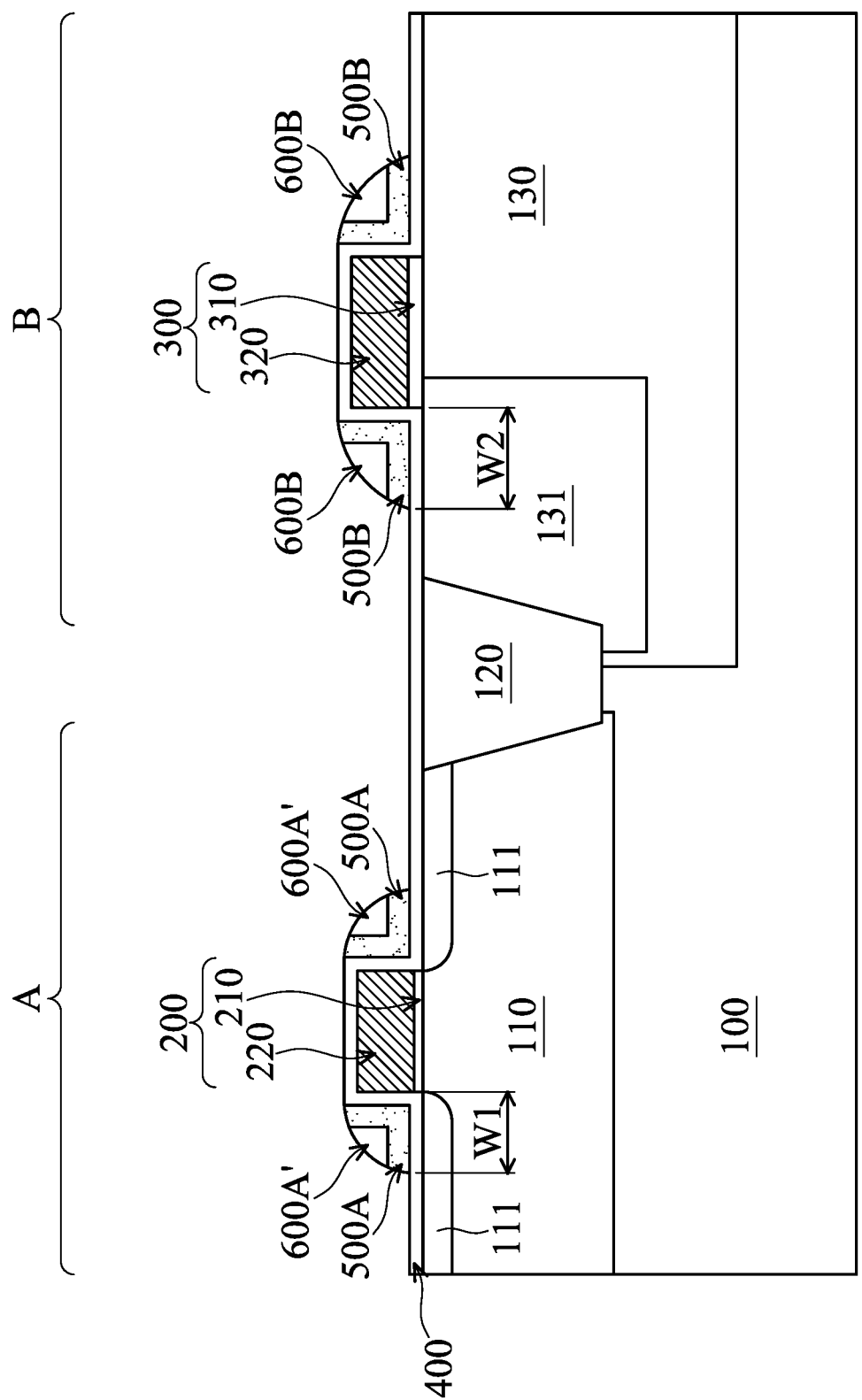

According to some embodiments of the present disclosure, the width of the etching mask 600A' formed by using the aforementioned photoresist pattern 700 and the etching process is not limited to the third thickness T3, wherein the third thickness T3 is the initial thickness of the third dielectric layer 600 formed on the second dielectric layer 500. Similarly, the width of the first portion of the second dielectric layer 500 is not limited to the second thickness T2, wherein the second thickness T2 is the initial thickness of the second dielectric layer 500 formed on the first dielectric layer 400. The stacked spacer (for example, the first stacked spacer 51, as shown in FIG. 7) obtained by etching processes using the etching mask 600A' of the third dielectric layer and subsequently formed first portion (for example, the first portion 500A of the second dielectric layer 500, as shown in FIG. 6) of the second dielectric layer as etching masks have more possibility and aspects. For example, when the third dielectric layer 600 has a specific third thickness T3 and the method for forming the semiconductor structure of the present disclosure is not used, the width of the etching mask 600A' formed by etching the third dielectric layer 600 is fixed. Therefore, it is impossible to form stacked spacers with different widths in the first region A and the second region B. Therefore, the present disclosure not only forms stacked spacers with different widths at the same time, but also provides a forming method having an improved process window.

Figure 5:
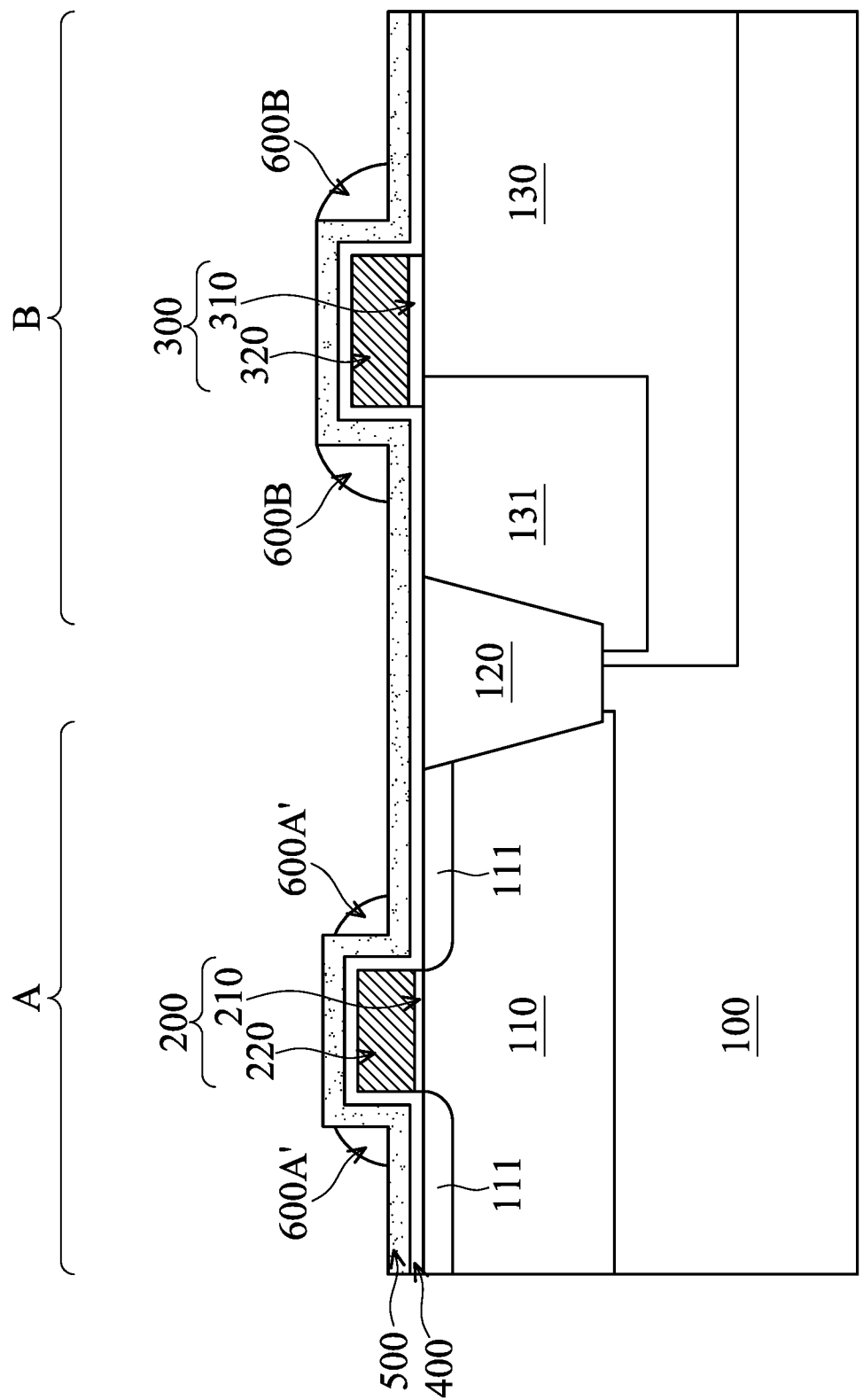

Referring to FIG. 5, in some embodiments, an ashing or a wet strip process may then be performed to remove the photoresist pattern 700.

Referring to FIG. 6, after removing the photoresist pattern 700, the second dielectric layer 500 is etched by using the etching mask 600A' of the third dielectric layer 600 as an etching mask in the first region A and the second portion 600B of the third dielectric layer 600 as an etching mask in the second region B, to expose a top surface of the first dielectric layer 400 and form a first portion 500A of the second dielectric layer 500 and a second portion 500B of the second dielectric layer 500. In some embodiments, the first portion 500A of the second dielectric layer 500 is located on the sidewall of the first dielectric layer 400 in the first region A, and the second portion 500B of the second dielectric layer 500 is located on the sidewall of the first dielectric layer 400 in the second region B. In some embodiments, the etching process for etching the second dielectric layer 500 may be dry etching. In some embodiments, the aforementioned etching process is an anisotropic etching process. In some embodiments, the dry etching process and etchant used to etch the second dielectric layer 500 may be the same as or different from the dry etching process and etchant used to etch the third dielectric layer 600. In some embodiments, the first dielectric layer 400 formed of a material different from the second dielectric layer 500 may be used as an etch stop layer. In some embodiments, the shape composed of the etching mask 600A' of the third dielectric layer 600 and the first portion 500A of the second dielectric layer 500 is similar to a spacer, and the shape composed of the second portion 600B of the third dielectric layer 600 and the second portion 500B of the second dielectric layer 500 is similar to a spacer.

Referring to FIG. 7, first dielectric layer 400 is etched by using the etching mask 600A' of the third dielectric layer 600 and the first portion 500A of the second dielectric layer 500 as an etching mask in the first region A and the second portion 600B of the third dielectric layer 600 the second portion 500B of the second dielectric layer 500 as an etching mask in the second region B, to form a first portion 400A of the first dielectric layer 400 and a second portion 400B of the first dielectric layer 400. In some embodiments, the first portion 400A of the first dielectric layer 400 is located on the sidewall of the first gate structure 200, and the second portion 400B of the first dielectric layer 400 is located on the sidewall of the second gate structure 300. In some embodiments, the etching process for etching the first dielectric layer 400 may be wet etching to avoid damage to the substrate 100 during the wet etching process. In some embodiments, the wet etching process and etchant used to etch the first dielectric layer 400 may be the same as or different from the wet etching process and etchant used to etch the third dielectric layer 600. In some embodiments, the shape composed of the etching mask 600A' of the third dielectric layer 600, the first portion 500A of the second dielectric layer 500 and the first portion 400A of the first dielectric layer 400 is similar to a spacer, and the shape composed of the second portion 600B of the third dielectric layer 600, the second portion 500B of the second dielectric layer 500 and second portion 400B of the first dielectric layer 400 is similar to a spacer. Thus, the first stacked spacer S1 on the substrate 100 and covering the sidewall of the first gate structure 200 may comprise the etching mask 600A', the first portion 500A and the first portion 400A. The second stacked spacer S2 on the substrate 100 and covering the sidewall of the second gate structure 300 may comprise the second portion 600B, the second portion 500B and the second portion 400B. In some embodiments, the first stacked spacer S1 and/or second stacked spacer S2 may be gate spacer.

In some embodiments, the first stacked spacer S1 has a first width W1, a second stacked spacer S2 has a second width W2, and the first width W1 is greater than the second width W2. For example, the first width W1 is range in about 0.05 to 0.1 um, and the second width W2 is range in about 0.08 to 0.2 um. According to some embodiments of the present disclosure, the first width W1 of the first stacked spacer S1 may be adjusted by varying the width of the etching mask 600A'. The etching mask 600A' is the reduced first portion 600A as shown in FIGS. 3 and 4. Further, the second width W2 of the second stacked spacer S2 may be adjusted by varying the width of the third thickness T3 of the third dielectric layer 600. Compared with the breakdown voltage of the semiconductor structure having the spacer with constant width, the breakdown voltage of the semiconductor structure having the spacers with at least two kinds of widths may be improved at least about 5V.

In some embodiments, appropriate dopants are implanted into the substrate 100 by performing an ion implantation process to form a first source/drain region 112 and a second source/drain region 132 close to the top surface of the substrate 100, respectively, thereby obtain a semiconductor structure 1 of the present disclosure. In some embodiments, the first source/drain region 112 and the second source/drain region 132 may subsequently be electrically connected with source/drain contacts of the low-voltage device in the first region A and source/drain contacts of the high-voltage device in the second region B, respectively. The source/drain contacts of the high-voltage components are electrically connected. In some embodiments, the first source/drain region 112 and the second source/drain region 132 are disposed on the outer sides of the first stacked spacer S1 and the second stacked spacer S2, respectively. In some embodiments, the doping concentrations of the first source/drain region 112 and the second source/drain region 132 are greater than the doping concentration of the lightly doped region 111, for example, about 1E+15 atoms/cm$^3$ to about 1E+22 atoms/cm$^3$. In some embodiments, the first source/drain region 112 has the same conductivity type as the lightly doped region 111, and the second source/drain region 132 has the opposite conductivity type to the body region 131. In some embodiments, further processes such as forming source/drain contacts may be performed on the semiconductor structure 1 to obtain an integrated device integrating high-voltage devices and low-voltage devices.

As shown in FIG. 7, in the first region A of the semiconductor structure 1, since the covering effect caused by the first stacked spacer S1 during the ion implantation process, a distance between the first source/drain region 112 and the first gate structure 200 is substantially same as the first width W1 of the first stacked spacer S1. Similarly, in the second region B of the semiconductor structure 1, since the covering effect caused by the second stacked spacer S2 during the ion implantation process, a distance between the second source/drain region 132 and the second gate structure 300 is substantially same as the second width W2 of the second stacked spacer S2. Accordingly, the semiconductor structure 1 of the present disclosure provides both the first stacked spacer S1 with a smaller width in the first region A and the second stacked spacer S2 with a greater width in the second region B to improve the utility of the substrate 100 in the first region A. At the same time, the second stacked spacer S2 may be used to maintain an appropriate distance between the second gate structure 300 in the second region B and the second source/drain region 132 on the opposite side of the second gate structure 300. Thus, the electric field gradient around the second gate structure 300 may effectively reduce. The second gate structure 300 is prevented from being exposed to the high electric field. In addition, the first stacked spacer S1 may also be used to maintain an appropriate distance between the first gate structure 200 in the first region A and the first source/drain region 112 on the opposite side of the first gate structure 200. In some embodiments, a first channel region CH1 is located in the first well region 110 and is symmetrical to the first gate structure 200. A second channel region CH2 is located only in the body region 131 and is asymmetrical to the second gate structure 300. Compared with the second region B, which is a symmetrical component, asymmetrical arrangement of the second channel region CH2 may reduce the on-resistance ($R_{on}$) by about 20%, but it is not limited thereto.

Figure 8:
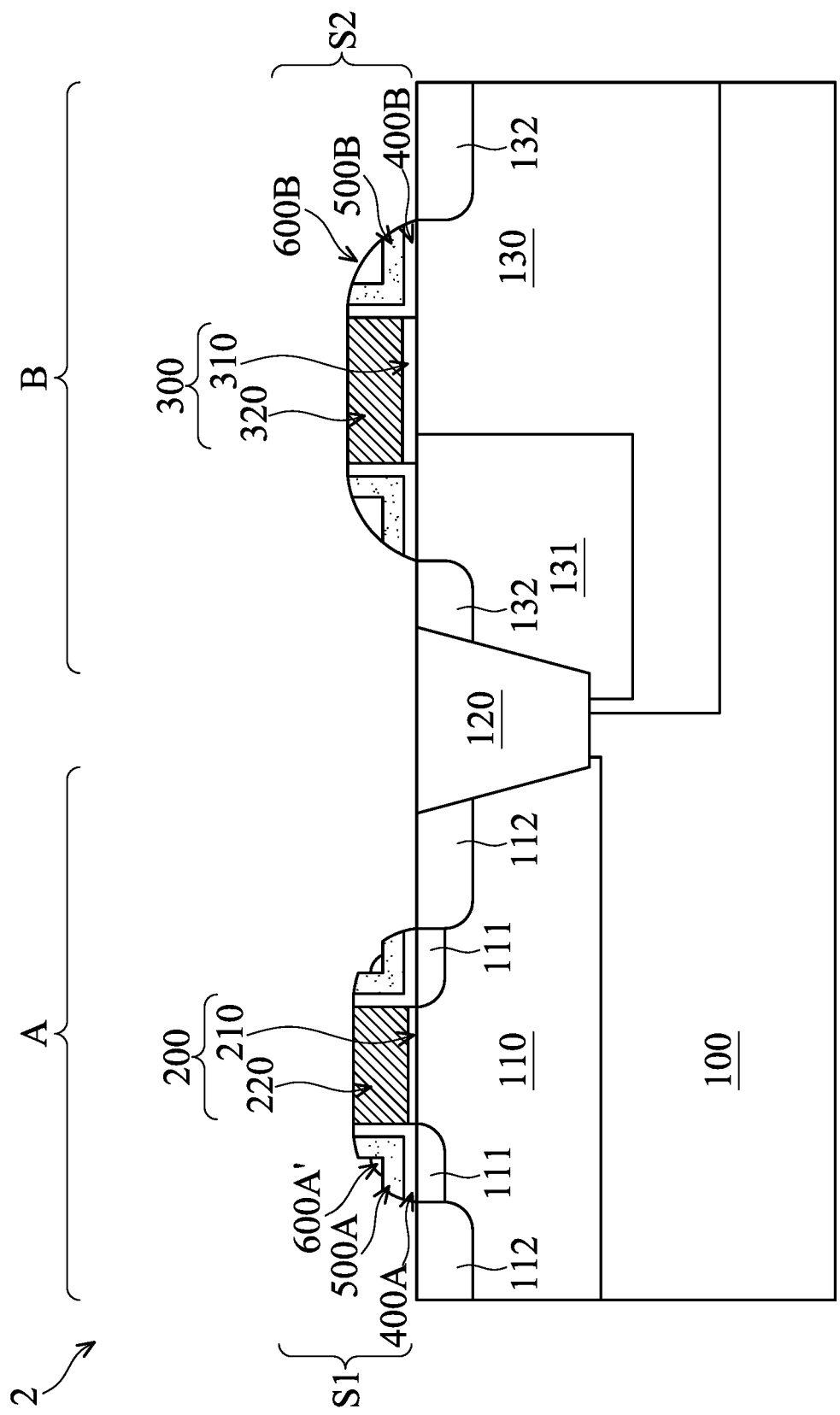
FIGS. 8 and 9 are schematic cross-sectional views of semiconductor structures in various aspects, according to some embodiments of the present disclosure.

Referring to FIG. 8, in other embodiments, during the wet etching process for etching the first dielectric layer 400, since the third dielectric layer 600 and the first dielectric layer 400 may comprise the same or similar oxide, the etching mask 600A' is at least partially removed at the same time. It should be noted that since the size of the etching mask 600A' is smaller than that of the second portion 600B, when the etching mask 600A' is significantly reduced due to the aforementioned wet etching process, the size of the second portion 600B may not change significantly, that is the size of the second portion 600B is substantially maintained, or the second portion 600B is partially removed correspondingly, that is the size of the second portion 600B is substantially reduced. In other words, the size of the partially removed etching mask 600A' shown in FIG. 8 is smaller than the size of the etching mask 600A' shown in FIG. 7. In some embodiments, as shown in FIG. 8, when the size of the second portion 600B in the semiconductor structure 2 is not significantly changed, the first stacked spacer S1 may comprise a portion of the third dielectric layer 600. In some embodiments, the aforementioned portion of the third dielectric layer 600 may be a partially removed etching mask 600A'.

Figure 9:
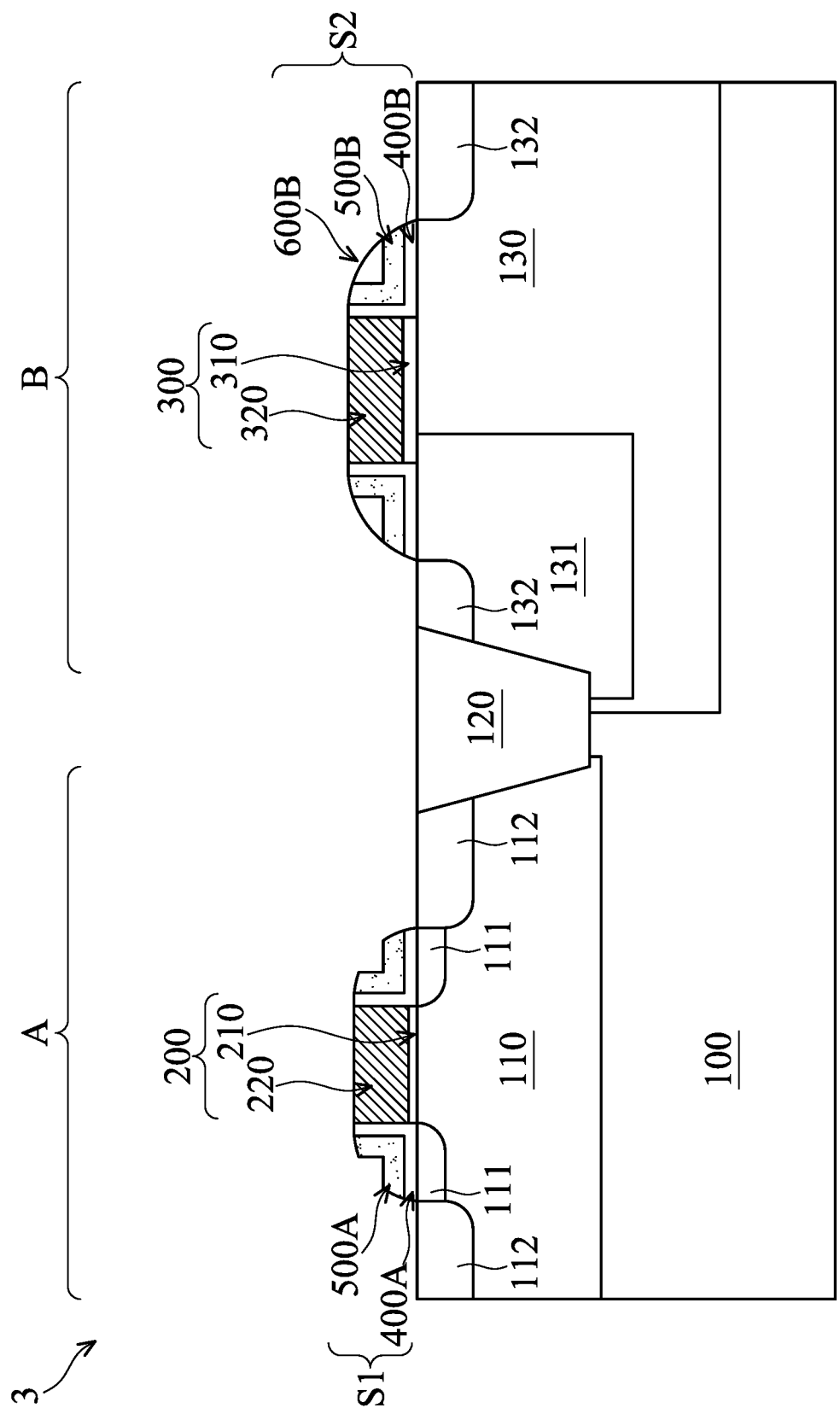

Referring to FIG. 9, in other embodiments, during the wet etching process for etching the first dielectric layer 400, since the third dielectric layer 600 and the first dielectric layer 400 may comprise the same or similar oxide, the etching mask 600A' is completely removed. As shown in FIG. 9, in the semiconductor structure 3, the first stacked spacer S1 may comprise a first portion 500A and a first portion 400A, and the second stacked spacer S2 may comprise a second portion 600B, a second portion 500B, and a second portion 500B. In some embodiments, as shown in FIG. 9, the first stacked spacer 51 has a recess. For example, the first stacked spacer 51 has an L-shaped shape.

In summary, according to some embodiments of the present disclosure, the present disclosure adjusts the width of the first etching mask; etches the second dielectric layer by using the first etching mask and the second etching mask followed by etches the first dielectric layer, to form the first stacked spacer disposed on the first gate structure and the second stacked spacer disposed on the second gate structure. Wherein the second portion of the third dielectric layer is used as the second etching mask. Accordingly, the first stacked spacer with a greater width and the second stacked spacer with a smaller width are obtained. Therefore, the method for forming the semiconductor structure of the present disclosure can accurately form stacked spacer with a predetermined width according to requirements.

In addition, the method for forming the semiconductor structure of the present disclosure can form the stacked spacers with required widths for the characteristics of the high-voltage devices and the low-voltage devices in the same process without additional process costs. For example, the high-voltage components and the low-voltage components are integrated into the semiconductor structure at the same time without formation of additional films and/or layers. Furthermore, in the method for forming the semiconductor structure of the present disclosure, since the second dielectric layer and the first dielectric layer are respectively used as the etch stop layer, unnecessary damage to the layers in the semiconductor structure will be prevented, thereby avoiding affecting the reliability of the subsequently formed stacked spacer.

The foregoing outlines features of several embodiments of the present disclosure, so that a person of ordinary skill in the art may better understand the aspects of the present disclosure. A person of ordinary skill in the art should appreciate that, the present disclosure may be readily used as a basis for changing, replacing, substituting and/or modifying other processes and structures for carrying out the same purposes and/or achieving the same advantages of the embodiments introduced herein. A person of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor structure, comprising:
   providing a substrate comprising a first region and a second region;
   forming a first gate structure on the first region;
   forming a second gate structure on the second region;
   sequentially forming a first dielectric layer, a second dielectric layer, and a third dielectric layer to cover the first gate structure and the second gate structure;
   patterning the third dielectric layer to form a first portion of the third dielectric layer and a second portion of the third dielectric layer in the first region and the second region, respectively;
   covering the second portion and partially removing the first portion of the third dielectric layer to form a first etching mask;
   patterning the second dielectric layer by using the first etching mask and the second portion of the third dielectric layer as a second etching mask, to expose a portion of the first dielectric layer;
   removing the portion of the first dielectric layer to form a first stacked spacer and a second stacked spacer on sidewalls of the first gate structure and the second gate structure, respectively;
   wherein a width of the first stacked spacer is smaller than a width of the second stacked spacer.

2. The method as claimed in claim 1, wherein the first stacked spacer comprises a portion of the first dielectric layer and a portion of the second dielectric layer, and the second stacked spacer comprises a portion of the first dielectric layer, a portion of the second dielectric layer, and a portion of the third dielectric layer.

3. The method as claimed in claim 2, wherein the first stacked spacer further comprises a portion of the third dielectric layer.

4. The method as claimed in claim 2, wherein the second dielectric layer is patterned to form the portion of the second dielectric layer in the first stacked spacer and the portion of the second dielectric layer in the second stacked spacer on sidewall of the first dielectric layer.

5. The method as claimed in claim 2, wherein the formation of the first stacked spacer comprises removing the first dielectric layer not covered by the first etching mask and the portion of the second dielectric layer; and the formation of the second spacer comprises removing the first dielectric layer not covered by the second etching mask and the portion of the second dielectric layer.

6. The method as claimed in claim 1, wherein the first portion of the third dielectric layer and the second portion of the third dielectric layer are formed on sidewall of the second dielectric layer.

7. The method as claimed in claim 1, wherein a top surface of the first etching mask is lower than a top surface of the second dielectric layer, a top surface of the second portion of the third dielectric layer is substantially level with the top surface of the second dielectric layer.

8. The method as claimed in claim 1, wherein the second region is covered by a photoresist pattern.

9. The method as claimed in claim 8, wherein the photoresist pattern is removed after covering the second region and before patterning the second dielectric layer.

10. The method as claimed in claim 1, wherein at least a portion of the first etching mask is removed during the removal of the portion of the first dielectric layer.

11. The method as claimed in claim 1, wherein the first etching mask is completely removed during the removal of the portion of the first dielectric layer.

12. The method as claimed in claim 1, wherein the first dielectric layer and the second dielectric layer have different etching selectivities, and the second dielectric layer and the third dielectric layer have different etching selectivities.

13. The method as claimed in claim 1, further comprising:
forming a first source/drain region in the first region; and
forming a second source/drain region in the second region and located on opposite sides of the second gate structure.

14. The method as claimed in claim 1, further comprising:
forming an isolation structure in the substrate and between the first region and the second region.

15. The method as claimed in claim 1, wherein the first region is a low-voltage device region and the second region is a high-voltage device region.

* * * * *